United States Patent [19]
Botez et al.

[11] Patent Number: 4,805,176
[45] Date of Patent: Feb. 14, 1989

[54] PHASE-LOCKED LASER ARRAY WITH PHASE-SHIFTING SURFACE COATING

[75] Inventors: Dan Botez, Lumberton Township, Burlington County; Bruce F. Bogner, Mt. Holly Township, Burlington County, both of N.J.

[73] Assignee: General Electric Company, Schenectady, N.Y.

[21] Appl. No.: 563,603

[22] Filed: Dec. 20, 1983

[51] Int. Cl.⁴ .............................................. H01S 3/13
[52] U.S. Cl. ....................................... 372/29; 372/18; 372/27
[58] Field of Search .............................. 372/18, 27, 29

[56] References Cited

U.S. PATENT DOCUMENTS

| | | | |
|---|---|---|---|
| 3,701,047 | 10/1972 | Caplan et al. | 331/94.5 |
| 3,753,801 | 8/1973 | Lockwood et al. | 148/171 |
| 4,092,659 | 5/1978 | Ettenberg | 357/18 |
| 4,178,564 | 12/1979 | Ladany et al. | 331/94.5 |
| 4,255,717 | 3/1981 | Scifres et al. | 331/94.5 |
| 4,347,486 | 8/1982 | Botez | 372/46 |
| 4,369,513 | 1/1983 | Umeda et al. | 372/46 |

OTHER PUBLICATIONS

Lothian, *Optics and Its Uses*, 1975, pp. 1–5.
Katz et al., "Diffraction Coupled Phase-Locked Semiconductor Laser Array", Appl. Phys. Letters; vol. 42, No. 7; 1 Apr. 1983; pp. 554–556.
D. E. Ackley, Applied Physics Letters, 42, 152 (1983).
J. Katz et al., Applied Physics Letters, 42, 554 (1983).
D. R. Scifres et al., Electronics Letters, 19, 169 (1983).
D. R. Scifres et al., Electronics Letters, 18, 549 (1982).
Ackley et al., "Phase-Locked Injection Laser Arrays with Integrated Phase Shifters", RCA Review, vol. 44, Dec. 1983, pp. 625–633.
Matsumoto et al., "Single-Lobed Far-Field Pattern Operation in a Phased Array with an Integrated Phase Shifter," *Appl. Phys. Lett*, 50 (22), 1 Jun. 1987, pp. 1541–1543.
Taneya et al., "Stable Quasi 0° Phase Mode Operation in a Laser Array Diode Nearly Aligned with a Phase Shifter", *Appl. Phys. Lett.*, 50 (13), 30 Mar. 1987, pp. 783–785.
Taneya et al., Abstract, "Diffrection-Limited Single Beam Emitted from an Array Diode with a Phase Shifter", Conference on Lasers and Electro-Optics, 26 Apr.–1 May 1987, Baltimore, Md., pp. 316–317.

*Primary Examiner*—William L. Sikes
*Assistant Examiner*—Robert E. Wise
*Attorney, Agent, or Firm*—Henry I. Steckler; James C. Davis, Jr.; Paul R. Webb, II

[57] ABSTRACT

A phase-locked semiconductor laser array having a plurality of lasing regions includes phase-shifting means on the emitting surface thereof through which laser light is emitted. The phase-shifting means provide a phase shift for those laser beams passing therethrough so that the phases of all the emitted laser beams are substantially the same. The phase-shifting means include a coating on the emitting surface which has a spatially varying thickness in the lateral direction.

9 Claims, 1 Drawing Sheet

PHASE-LOCKED LASER ARRAY WITH PHASE-SHIFTING SURFACE COATING

The invention relates to a phase-locked semiconductor laser array having on the emitting surface means for shifting the relative phase of the light emitted from alternate elements of the array.

BACKGROUND OF THE INVENTION

A semiconductor injection laser typically comprises a body of semiconductor material having a thin active layer between cladding regions of opposite conductivity type. To increase the output power, a guide layer having a refractive index which is intermediate between that of the active and cladding layers may be interposed between one of the cladding regions and the active region. Light generated in the active layer propagates in both the active and guide layers thereby forming a larger beam at the emitting facet of the body. The cavity region, comprising an active layer or the combination of a guide layer and an active layer, restricts oscillation in the transverse direction, the direction perpendicular to the plane of the layers, to the fundamental transverse mode. In the lateral direction, the direction in the plane of the layers and perpendicular to the axis of light propagation, it has been found useful to introduce structural variations which produce an optical waveguide which in turn restricts the oscillation to the fundamental lateral mode. Lasers incorporating transverse and lateral waveguides, such as that disclosed by Botez in U.S. Pat. No. 4,347,486, incorporated herein by reference, may have output powers in excess of about 40 milliwatts in the fundamental lateral and transverse mode.

To increase the output power in the laser beam beyond the capability of such an individual laser, monolithic arrays of spaced-apart laser devices have been fabricated wherein the modes of oscillation of the individual lasers are coupled to one another to form a single phase-locked coupled oscillator. Such arrays operating in a single longitudinal mode to output powers as high as 80 milliwatts have been observed. However, a problem with a typical phase-locked array is that nearly all of the devices have operated in such a manner that the far-field radiation pattern in the plane in the lateral direction has consisted of two lobes symmetrically located about the normal to the emitting surface of the array. This far-field radiation pattern results because of gain considerations that cause adjacent devices to operate such that the relative phase is 180° and is undesirable from a systems viewpoint because it requires excessively large optics to collimate the emitted beam. It would be desirable to have a phase-locked semiconductor laser array operating in the single transverse and lateral mode and having a far-field radiation pattern comprising a single lobe oriented perpendicular to the emitting surface of the laser.

SUMMARY OF THE INVENTION

A phase-locked semiconductor laser array comprises a semiconductor body having an emitting surface. The body typically includes a substrate with a cavity region overlying the substrate and means for defining a plurality of lasing regions in the cavity region, each of said regions being spaced an effective distance from the adjacent regions so that the different modes of laser oscillation of the lasing regions are phase-locked to one another. The array also includes means for adjusting the relative phases of the laser beams emitted by the lasing regions such that the phases of the emitted laser beams are about the same. The phase-shifting means provide an output beam from the array which has substantially all of its power in the central beam of the far-field radiation pattern.

DETAILED DESCRIPTION OF PREFERRED EMBODIMENT

Figure 1:
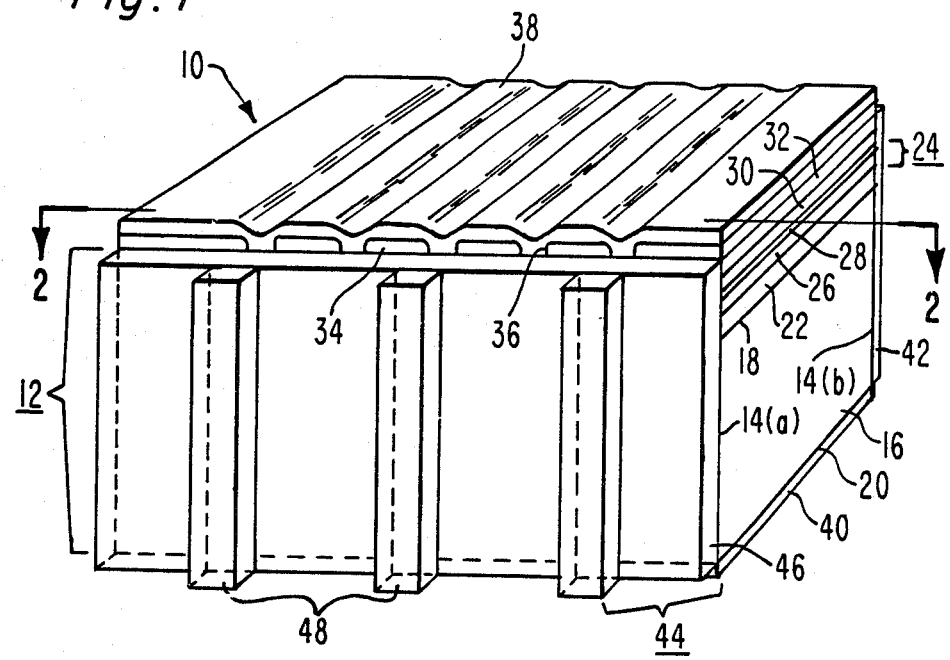
FIG. 1 is a perspective view of a laser array of the invention.
Figure 2:
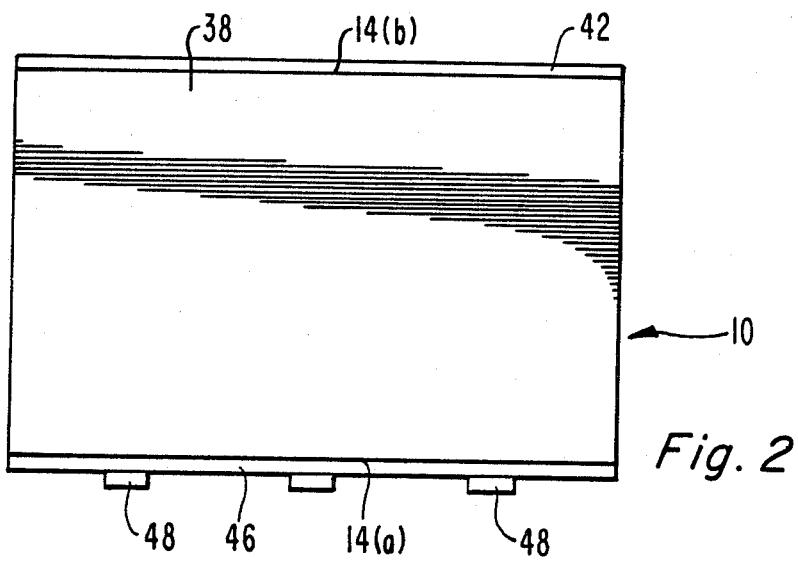
FIG. 2 is a top view of the array of FIG. 1 along the line 2—2.

In FIGS. 1 and 2 a laser array 10 embodying the principles of the invention includes a semiconductor body 12 having spaced, substantially parallel reflecting surfaces 14(a) and 14(b). The body 12 includes a substrate 16 having first and second major surfaces 18 and 20, respectively. A first cladding layer 22 overlies the first major surface 18 and a cavity region 24 comprising a guide layer 26 and an active layer 28, overlies the first cladding layer 22. A second cladding layer 30 overlies the cavity region 24 and a capping layer 32 overlies the second cladding layer 30. An electrically insulating layer 34 overlies the capping layer 32 and has a plurality of openings 36 therethrough which extend between the reflecting surfaces 14(a) and (b). A first electrical contact 38 overlies the electrically insulating layer 34 and the capping layer 32 in the openings 36. A second electrical contact 40 overlies the second major surface 20.

A reflective coating 42 overlies the light-reflecting surface 14(b) and a substantially transparent coating 44 comprised of a passivation layer 46 and phase elements 48 overlies the surface 14(a) through which light is emitted.

The lasing region of the array 10 is defined by the striped electrical contacts to the capping layer 32 in the openings 36. The striped contacts restrict the current flow between the electrical contacts 38 and 40 to regions centered under the stripes, as is well known in the art. The cavity region 24 is then electrically pumped and will exhibit laser action in the regions centered under the stripes.

The invention is applicable to any injection laser array having therein means for defining a plurality of lasing regions spaced an effective distance apart in the lateral direction from the adjacent lasing regions such that the modes of laser oscillation of the lasing regions have sufficient coupling to one another to establish the phase-locked condition. These means include structures which provide laterally spaced optical guides or which restrict the electrical current flow in the lateral direction. Botez et al., in U.S. Pat. No. 4,547,396 and incorporated herein by reference, has disclosed a laser array wherein the lasing regions are defined by channels in the substrate which form index guides in the lateral direction. The index guides define the lasing regions as portions of the cavity region centered over the channels. Ackley, in Applied Physics Letters 42, 152 (1983), has disclosed an array wherein the elements are defined by channels in the second cladding layer combined with a zinc diffusion into the surface of the channelled layer. The combination of the channels and the diffusion confines the lasing regions to the portions of the cavity region between the channels.

The emitting surface of the laser array may be a partially transparent reflecting surface as shown in FIGS. 1 and 2 or the outer surface of a partially reflecting, partially transmitting region. This region may comprise a monolithically integrated diffraction grating.

The alloys used for the particular layers of the array should be such that the refractive index of the active layer 28 is greater than the refractive index of the guide layer 26 which in turn is greater than the refractive index of the cladding layers 22 and 30. The laser array of the invention may be formed of materials such as GaAs and AlGaAs alloys which have the requisite refractive index differences. Alternatively, alloys of other Group III or V elements such as In, Ga, P, Sb and As may be used.

The substrate 16 and the first cladding layer 22 are of one conductivity type and the second cladding layer 30 and the capping layer 32 are of the opposite conductivity type. In the cavity region 24 the positions of the guide layer 26 and the active layer 28 are interchangeable. The guide layer 26, if present, is preferably positioned between the first cladding layer 22 and the active layer 28 and, in this case, has the same conductivity type as the first cladding layer 22. In some applications the guide layer may be positioned between the active layer 28 and the second cladding layer 30 in which case the guide layer 26 has the same conductivity type as the second cladding layer 30. In other applications the guide layer may be absent with the laser action then confined to a cavity region comprising only the active layer 28.

The laser array of the invention may be fabricated using well-known liquid-phase epitaxy techniques such as those disclosed by Lockwood et al. in U.S. Pat. No. 3,753,801, by Botez in U.S. Pat. No. 4,347,486, both of which are incorporated herein by reference, and by Botez et al. in U.S. Pat. No. 4,547,396, referred to above. Alternatively vapor-phase or molecular-beam epitaxy techniques well known in the art may be used.

The substrate 18 is preferably composed of N-type GaAs having a first major surface 18 which is parallel to or slightly misoriented from the (100) crystallographic plane. The first cladding layer 28 is typically composed of N-type $Al_rGa_{1-r}As$ where r is between about 0.2 and 0.45 and preferably between about 0.25 and 0.35. This layer is typically between about 0.2 and 0.5 micrometers (μm) thick. The guide layer 26 is typically between about 0.3 and 0.6 μm thick and is composed of N-type $Al_xGa_{1-x}As$ where x is between about 0.15 and 0.30. The active layer 28 is typically between about 0.05 and 0.12 μm thick and is typically composed of $Al_yGa_{1-y}As$ where y is between about 0.0 and 0.15 and preferably between about 0.03 and 0.12. The second cladding layer 30 is typically between about 0.8 and 1.5 μm thick and is typically composed of P-type $Al_zGa_{1-z}As$ where z is between 0.25 and 0.45 and preferably between about 0.3 and 0.35. The capping layer 32 is typically composed of P-type GaAs and is used to facilitate ohmic electrical contact between the underlying semiconductor material and the overlying metal contact. This layer is typically between about 0.5 and 1.0 μm thick.

The electrically insulating layer 34 is typically composed of silicon dioxide which is deposited by pyrolytic decomposition of a silicon-containing gas, such as silane, in oxygen or water vapor. An opening 36 is formed through the electrically insulating layer 34 using standard photolithographic masking techniques and etching processes. The electrical contact 38 is then deposited over the capping layer 32 where it is exposed in the openings 36. This contact is preferably composed of sequentially evaporated titanium, platinum and gold. The second electrical contact 40 to the substrate 18 is formed by sequential evaporation of germanium, gold, nickel and gold layers, followed by a sintering step.

The light reflector 42 typically may consist of an electrical insulator such as silicon dioxide coated with a layer of gold as disclosed by Caplan et al. in U.S. Pat. No. 3,701,047. Alternatively the reflector may be a multi-layer reflector such as that disclosed by Ettenberg in U.S. Pat. No. 4,092,659. Both of these patents are incorporated herein by reference.

The passivation layer 46 on the partially transparent reflective surface 14(a) is substantially transparent and serves to reduce the damage to the surface during laser operation. This layer is typically composed of a material such as aluminum oxide, silicon monoxide or dioxide, silicon nitride or carbon having an optical thickness of about an integral multiple of one-half wave at the lasing wavelength as disclosed by Ladany et al. in U.S. Pat. No. 4,178,564, incorporated herein by reference. Alternatively the passivation layer 46 may have an optical thickness of about an odd integral number of quarter waves at the lasing wavelength. This layer may be formed using electron beam evaporation techniques well known in the art.

The phase-shifting elements 48 are substantially transparent at the lasing wavelength and composed of a material such as aluminum oxide, silicon dioxide or monoxide, silicon nitride or carbon. The elements 48 are located on the passivation layer 46 if present, or on the reflecting surface 14(a) over alternate portions of the surface 14(a) from which laser radiation is emitted. The elements have a thickness sufficient to provide a phase shift for laser light passing therethrough of about 180°.

The laser beams emitted from each of the lasing regions of the array are then substantially in phase with respect to one another in a plane beyond the array at a distance from the reflecting surface 14(a) greater than the thickness of the phase shifting element 48 and any other layers on the surface. This plane may be oriented parallel to or slightly tilted from the plane of the emitting surface over the width of the array. A tilt of this plane may arise from a small variation of the relative phase of the elements across the array which is not necessarily compensated by the coating phase shift.

The coating thickness may be calculated using the following analysis. The phase change $\phi_e$ of a laser beam passing through a phase element 48 is $$\phi_e = 2\pi l n_e / \lambda_o$$

where $\lambda_o$ is the lasing wavelength in the air, $n_e$ is the real part of the refractive index at the lasing wavelength of the material comprising a phase element 48, and l is the thickness of the phase element 48. The corresponding phase change $\phi_a$ of a laser beam emitted from the alternate lasing regions and passing through the same thickness l of the ambient is:

$$\phi_a = 2\pi l n_a / \lambda_o$$

where $n_a$ is the refractive index of the ambient at the lasing wavelength. The relative phase shift of the beams passing through the phase-shifting elements 48 compared to that of the laser beams passing through an equal thickness of the ambient is then:

$$\Delta\phi = \phi_e - \phi_a = 2\pi l (n_e - n_a)/\lambda_o$$

The thickness L of the phase-shifting elements 48 to produce a relative phase shift of 180° or an odd integral multiple j thereof is then:

$$L = (2j+1)\lambda_o/2(n_e - n_a) \quad (1)$$

For an air ambient, $n_a = 1$, and silicon dioxide or aluminum oxide phase-shifting elements ($n_e = 1.5$), a laser wavelength $\lambda_o$ of 0.820 $\mu$m and $j = 0$, the thickness of the phase-shifting elements 48 is 0.281 $\mu$m.

Preferably the thickness of the phase-shifting elements 48 is also an integral number of half waves at the lasing wavelength so that the optical properties of the reflecting surface 14(a) are not altered, as discussed by Ladany et al. The thickness L then must also satisfy the relation $$L = m\lambda_o/2n_e \quad (2)$$

where m is an integer. From these two equations for L and the integers j and m, the refractive index of the phase elements $n_e$ satisfying both of these conditions is:

$$n_e = mn_a/(m - 2j - 1). \quad (3)$$

Combining Equations (2) and (3), the preferred thickness of a phase-shifting elements 48 is:

$$L = \lambda_o(m - 2j - 1)/2n_a \quad (4)$$

For an air ambient, $n_a = 1$, and $m \leq 2j + 1$, there are no solutions to Equation (4). For $j = 0$ and $m = 2$, $L = \lambda_o/2$ and $n_e = 2$ which may be obtained using a silicon oxynitride alloy. For $j = 0$ and $m = 3$, $L = \lambda_o$ and $n_e = 1.5$ which is approximately the refractive index of aluminum oxide. For $j = 0$ and $m = 4$, $L = 1.5 \lambda_o$ and $n_e = 1.33$ which is approximately the refractive index of magnesium oxide.

The phase-shifting elements 48 may be formed using electron beam evaporation techniques well known in the art. The elements may be defined so that their thickness over alternate lasing regions is greater than that over the adjacent regions using an evaporation mask during the electron beam evaporation process. Alternatively the elements may be formed using photolithographic and etching techniques or lift-off techniques.

Preferably the materials comprising the passivation layer 46 and the phase-shifting elements 48 are chosen such that the material comprising the passivation layer is insoluble in the etchant used to remove portions of the phase-shifting elements. In this way an end stop to the etching process which prevents variation in the thickness of the passivation layer is automatically provided.

We claim:

1. In a phase-locked semiconductor laser array comprising
    a semiconductor body having an emitting surface, said body including a cavity region overlying a major surface of a substrate and means for defining a plurality of substantially parallel lasing regions, each of said lasing region spaced from adjacent regions by a distance that causes the radiation modes in adjacent lasing regions to be phase-locked to one another;
    the improvement wherein said array includes on the emitting surface means for shifting the relative phases of the laser beams emitted by the array such that the phases of all the emitted laser beams are substantially the same in a plane beyond the array.

2. The array of claim 1 wherein said phase shifting means comprise a coating having a spatially varying thickness in the lateral direction, a direction in the plane of the cavity region and perpendicular to the axis of light propagation.

3. The array of claim 2 wherein said thickness of the coating over alternate lasing regions is such that the phases of the laser beams emitted by the array are substantially the same.

4. The array of claim 3 wherein the thickness of said coating over said alternate lasing regions is sufficient to provide a phase-shift of about 180° for laser beams passing therethrough compared to the phase-shift of laser beams emitted by the adjacent channels and passing through an equal thickness of the ambient.

5. The array of claim 4 wherein a passivation layer is interposed between the emitting surface of the body and said coating.

6. The array of claim 5 wherein the passivation layer and the coating are composed of different materials.

7. The array of claim 4 wherein the thickness of said coating is an integral number of half wavelengths at the lasing wavelength in the ambient.

8. The array of claim 7 wherein a passivation layer is interposed between the emitting surface of the body and said coating.

9. The array of claim 8 wherein the passivation layer and the coating are composed of different materials.

* * * * *